United States Patent
Mieda et al.

(10) Patent No.: US 10,079,360 B2
(45) Date of Patent: Sep. 18, 2018

(54) RESIN COMPOSITION FOR SEALING ELECTRONIC DEVICES, AND ELECTRONIC DEVICE

(71) Applicant: FURUKAWA ELECTRIC CO., LTD., Tokyo (JP)

(72) Inventors: Tetsuya Mieda, Tokyo (JP); Takumi Asanuma, Tokyo (JP); Yasushi Ishizaka, Tokyo (JP); Keiji Saito, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/663,032

(22) Filed: Jul. 28, 2017

(65) Prior Publication Data

US 2017/0331070 A1 Nov. 16, 2017

Related U.S. Application Data

(63) Continuation of application No. PCT/JP2015/086528, filed on Dec. 28, 2015.

(30) Foreign Application Priority Data

Jan. 30, 2015 (JP) .................................. 2015-017222

(51) Int. Cl.
 *H01L 51/52* (2006.01)
 *H01L 23/29* (2006.01)
 (Continued)

(52) U.S. Cl.
 CPC ............ *H01L 51/524* (2013.01); *B01D 53/28* (2013.01); *B01J 20/223* (2013.01); *C09K 3/10* (2013.01);
 (Continued)

(58) Field of Classification Search
 CPC ..... H01L 51/52; H01L 51/524; H01L 51/525; H01L 51/5259; H01L 23/29; H01L 23/31;
 (Continued)

(56) References Cited

U.S. PATENT DOCUMENTS

2004/0256592 A1 12/2004 Takahashi et al.
2005/0227114 A1 10/2005 Tanaka et al.
(Continued)

FOREIGN PATENT DOCUMENTS

GB 1 473 335 A 5/1977
JP 59-042540 A 3/1984
(Continued)

OTHER PUBLICATIONS

International Search Report (PCT/ISA/210) issued in PCT/JP2015/086528, dated Mar. 8, 2016.
(Continued)

*Primary Examiner* — Monica D Harrison
(74) *Attorney, Agent, or Firm* — Birch, Stewart, Kolasch & Birch, LLP

(57) ABSTRACT

An electronic-device-sealing resin composition and an organic EL element, having, as a crosslinkable organometallic desiccant, a metal complex compound having crosslinkable alkoxide represented by formula (1) as a ligand:

$$M(ORx)_n \qquad \text{Formula (1)}$$

wherein, in formula (1), M designates Al, B, Ti or Zr; Rx in the ligand designates an alkyl group, an alkenyl group, an aryl group, a cycloalkyl group, a heterocyclic group, an acyl group, or a group represented by formula (a); at least one of Rx's has a crosslinkable group; and n designates a valence of M.

(Continued)

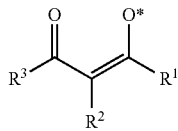

Formula (a)

wherein, in formula (a), O* designates O of ORx in formula (1); $R^1$ designates an alkyl group, an alkenyl group or an acyl group; $R^2$ designates a hydrogen atom or an alkyl group; and $R^3$ designates an alkyl group or an alkoxy group.

9 Claims, 2 Drawing Sheets

(51) Int. Cl.
  H05B 33/04 (2006.01)
  H01L 23/31 (2006.01)
  C09K 3/10 (2006.01)
  B01J 20/22 (2006.01)
  B01D 53/28 (2006.01)
(52) U.S. Cl.
  CPC .............. *H01L 23/29* (2013.01); *H01L 23/31* (2013.01); *H01L 51/5259* (2013.01); *H05B 33/04* (2013.01)
(58) Field of Classification Search
  CPC . H05B 33/04; C09K 3/10; B01D 53/28; B01J 20/223

USPC ........................................................ 257/788
See application file for complete search history.

(56) References Cited

U.S. PATENT DOCUMENTS

| | | | |
|---|---|---|---|
| 2009/0045729 A1 | 2/2009 | Fujita et al. | |
| 2013/0090408 A1 | 4/2013 | Sakamoto et al. | |
| 2016/0197288 A1* | 7/2016 | Ikeda | C09D 11/037 257/40 |

FOREIGN PATENT DOCUMENTS

| | | | |
|---|---|---|---|
| JP | 2005-007235 A | 1/2005 | |
| JP | 2006-003432 A | 1/2005 | |
| JP | 2011-026521 A | 2/2011 | |
| JP | 2012-036240 A | 2/2012 | |
| JP | 2012-038660 A | 2/2012 | |
| JP | 5062648 B2 | 10/2012 | |
| JP | 2013-082815 A | 5/2013 | |
| JP | 5213303 B2 | 6/2013 | |
| JP | 2014-140797 A | 8/2014 | |
| JP | 2015-086376 A | 5/2015 | |
| WO | WO 2011/001823 A1 | 1/2011 | |
| WO | WO 2011/027658 A1 | 3/2011 | |
| WO | WO 2012/018684 A1 | 2/2012 | |
| WO | WO 2012/063626 A1 | 5/2012 | |
| WO | WO 2012/086334 A1 | 6/2012 | |

OTHER PUBLICATIONS

Written Opinion (PCT/ISA/237) issued in PCT/JP2015/086528, dated Mar. 8, 2016.

* cited by examiner

RESIN COMPOSITION FOR SEALING ELECTRONIC DEVICES, AND ELECTRONIC DEVICE

CROSS-REFERENCE TO RELATED APPLICATIONS

This application is a Continuation of PCT International Application No. PCT/JP2015/086528 filed on Dec. 28, 2015, which claims priority under 35 U.S.C. § 119 (a) to Japanese Patent Application No. 2015-017222 filed in Japan on Jan. 30, 2015. Each of the above applications is hereby expressly incorporated by reference, in its entirety, into the present application.

TECHNICAL FIELD

The present invention relates to a resin composition for sealing electronic devices which contains a crosslinkable organometallic desiccant composed of a ligand having a crosslinkable group, and an electronic device sealed with this sealing resin composition. In particular, the present invention relates to bond or seal of an organic electronic device, an organic light-emitting diode element, a touch panel, a light-emitting diode (LED), and a solar cell.

BACKGROUND ART

The organic light-emitting diode element (hereinafter, also referred to as OLED element) has a problem with a gradual deterioration of the emission property, such as emission brightness and emission efficiency caused by the use thereof. Examples of the causes include organic matter denaturation and electrode oxidation, due to penetration of moisture or the like into the organic light-emitting diode element.

In order to prevent these problems, a technique for suppressing deterioration of the organic light-emitting diode element has been studied, by sealing the organic light-emitting diode element, thereby preventing moisture or the like from penetrating into the organic light-emitting diode element; and a technique of adding a moisture-reactive organometallic desiccant into a sealing resin has also been studied (for example, see Patent Literature 1 to 3). When the organometallic desiccant is added into the sealing resin, it is required to uniformly compatibilize the sealing resin with the moisture-reactive organometallic desiccant, or to suppress migration of alcohol released from the moisture-reactive organometallic desiccant.

However, in the technique which has been studied in the past in order to satisfy these requirements, it was necessary to make a degree of cross-linkage of the sealant cured material low, for example, by using a non-crosslinked material or a monoacrylate. Therefore, water vapor barrier property of these sealants is far from satisfactory.

CITATION LIST

Patent Literatures

Patent Literature 1: Japanese Patent No. 5062648
Patent Literature 2: JP-A-2012-38660 ("JP-A" means unexamined published Japanese patent application)
Patent Literature 3: Japanese Patent No. 5213303

SUMMARY OF INVENTION

Technical Problem

As describe above, a sealing resin in a conventional technology inevitably has a low crosslink density, and is far from sufficiently satisfying water vapor barrier property.

Further, while the inventors of the present invention have conducted study on the sealing resin, when a moisture-reactive organometallic desiccant is added into the sealing resin, an example of peeling of a sealing plate in humidification testing has been confirmed. As a result of studying the cause thereof in detail, it has been found that such peeling is caused by significant lowering of shear adhesive strength of a sealing material after the humidification testing. The reason is presumed that isopropyl alcohol eliminated from the moisture-reactive organometallic desiccant by a reaction with moisture is segregated in an interface between the sealing resin and the sealing plate to lower bond strength. When such a material is applied to an actual product, an organic light-emitting diode element absorbs moisture in the atmospheric air to cause deterioration over the lapse of time, and has a risk of causing a fault, resulting in poor sealing durability.

In view of the problem as describe above, the present invention is contemplated for providing: a sealing resin, which can realize a high crosslink density by using a crosslinkable organometallic desiccant composed of a ligand having a crosslinkable group, which suppress lowering of shear adhesive strength by humidification, and which has higher water vapor barrier property, smaller lowering of the shear adhesive strength by humidification, and excellent sealing durability, in comparison with a conventional sealant; and a resin composition for sealing electronic devices (hereinafter, also referred to as a "sealing resin composition") for preparing such a sealing resin.

In addition thereto, the present invention is contemplated for proving: an electronic device having excellent sealing performance and excellent sealing durability, by sealing a resin obtained by cured the resin composition for sealing electronic devices.

Solution to Problem

The inventors of the present invention diligently conducted study, in order to solve the above-described problem of the conventional technology, by focusing attention on a ligand of an organometallic desiccant.

As a result, the inventors have found that a crosslinkable organometallic desiccant composed of a ligand having a specific crosslinkable group is blended into a resin composition, to allow provision of high water vapor barrier property for a sealing resin formed by cured this resin composition, to realize of a high crosslink density, to suppress lowering of shear adhesive strength by humidification, to prolong sealing lifetime, and to realize high sealing durability.

That is, the present invention provides the following means:
(1) An electronic-device-sealing resin composition, comprising, as a crosslinkable organometallic desiccant, a metal complex compound having crosslinkable alkoxide represented by formula (1) as a ligand:

M(ORx)n　　　Formula (1)

wherein, in formula (1), M designates Al, B, Ti or Zr; Rx in the ligand designates an alkyl group, an alkenyl group, an aryl group, a cycloalkyl group, a heterocyclic group, an acyl group, or a group represented by formula (a); at least one of Rx's has a crosslinkable group; and n designates a valence of M.

Formula (a)

wherein, in formula (a), O* designates O of ORx in formula (1); $R^1$ designates an alkyl group, an alkenyl group or an acyl group; $R^2$ designates a hydrogen atom or an alkyl group; and $R^3$ designates an alkyl group or an alkoxy group.
(2) The electronic-device-sealing resin composition described in the above item (1), wherein the metal complex compound represented by formula (1) is represented by formula (2):

Formula (2)

wherein, in formula (2), M, Rx, n, $R^1$, $R^2$, and $R^3$ each have the same meaning as those in formula (1); and at least one of Rx's or at least one of $R^1$ to $R^3$ has a crosslinkable group.
(3) The electronic-device-sealing resin composition described in the above item (1) or (2), wherein at least one of the Rx's is a group in which replacement is made by a crosslinkable group selected from a thiol group, a (meth)acryloyloxy group, an isocyanate group, an oxetane group, and an epoxy group.
(4) The electronic-device-sealing resin composition described in any one of the above items (1) to (3), wherein at least one of the Rx's is an alkyl group in which replacement is made by a crosslinkable group selected from a thiol group, a (meth)acryloyloxy group, an isocyanate group, an oxetane group, and an epoxy group.
(5) The electronic-device-sealing resin composition described in any one of the above items (1) to (4), wherein the $R^3$ is an alkoxy group.
(6) The electronic-device-sealing resin composition described in any one of the above items (1) to (5), comprising a (meth)acrylate monomer.
(7) The electronic-device-sealing resin composition described in the above item (6), wherein the (meth)acrylate monomer is a (meth)acrylate ester monomer having a urethane bond in the molecule.
(8) The electronic-device-sealing resin composition described in any one of the above items (1) to (7), comprising 1 to 25 mass % of the crosslinkable organometallic desiccant in a whole resin.
(9) An organic EL element, having a laminate formed by interposing an organic light-emitting material layer composed of an organic material between a pair of electrodes facing to each other, a structure for blocking the laminate from the outside air, and a desiccator arranged within the structure, wherein the desiccator is formed of the electronic-device-sealing resin composition described in any one of the above items (1) to (8).

In the present invention, the numerical range expressed by using the expression "to" means a range including numerical values before and after the expression "to" as the lower limit and the upper limit.

Further, in the present invention, the term "(meth)acrylate" may be any of a methacrylate and an acrylate, and is used as a collective term. Accordingly, this term includes either one of a methacrylate and an acrylate, and a mixture thereof.

Herein, the (meth)acrylate includes a (meth)acrylic acid ester, a (meth)acrylic acid, and a (meth)acrylic acid salt.

Note that, generally the (meth)acryloyl group is also referred to as a (meth)acrylate group.

Advantageous Effects of Invention

According to the electronic-device-sealing resin composition containing a crosslinkable organometallic desiccant of the present invention, a sealing resin can be formed which has a high crosslink density and high water vapor barrier property. Further, according to the electronic device sealed with the sealing resin of the present invention, lowering of shear adhesive strength of the resin by humidification is suppressed, and the electronic device is excellent in sealing performance and sealing durability.

Other and further features and advantages of the invention will appear more fully from the following description, appropriately referring to the accompanying drawings.

MODE FOR CARRYING OUT THE INVENTION

The crosslinkable organometallic desiccant used that can be used in the present invention will be described.

<<Crosslinkable Organometallic Desiccant>>

The crosslinkable organometallic desiccant that can be used in the present invention is a metal complex compound having a crosslinkable alkoxide represented by formula (1) as a ligand.

$$M(ORx)n \qquad \text{Formula (1)}$$

In formula (1), M designates a central metal, and specifically designates Al, B, Ti or Zr. Above all, Al is preferred; Rx designates an alkyl group, an alkenyl group, an aryl group, a cycloalkyl group, a heterocyclic group, an acyl group, or a group represented by formula (a); at least one of Rx's has a crosslinkable group; and n designates a valence of M. Rx's may be an identical group or a plurality of different kinds of groups. Moreover, Rx's may be a multidentate ligand in which each Rx of a plurality of (ORx)n is bonded with any other Rx.

In addition, in formula (1), the ligand is expressed as M(ORx) by using n as a valence of M, but such a complex compound ordinarily exists in the form of a multimer.

In the metal complex compound represented by formula (1), a dimer or a higher multimer may be formed, by an oxygen atom bonded with the central metal M in the ORx group, causing coordination (-M-O(:M)R—) with the central metal M of the metal complex compound represented by formula (1). Moreover, the multimer is also formed, by formation of a -M-O-M- bond by elimination of alcohol by heating or an impurity. Herein, the former product in which two or more moieties of M(OR)n per se are linked is referred to as the multimer.

Specific examples of the crosslinkable group of the crosslinkable organometallic desiccant include a vinyl group, a thiol group (a mercapto group), a (meth)acryloyl group, a (meth)acryloyloxy group, an isocyanate group, an oxetane group, and an epoxy group, and a crosslinkable group selected from a thiol group, a (meth)acryloyloxy group, an isocyanate group, an oxetane group, and an epoxy group is preferred.

In the present invention, "crosslink" of the crosslinkable group means formation of a link (i.e. making a bridged structure), by a thiol-ene reaction, a cationic polymerization reaction, an anionic polymerization reaction, a radical reaction, or the like.

The crosslinkable group is preferably a polymerizable functional group. Specific examples of the polymerizable functional group include a vinyl group, an epoxy group, a (meth)acryloyl group, and a (meth)acryloyloxy group, each being radically polymerizable by light or heat. Above all, a (meth)acryloyl group and a (meth)acryloyloxy group are preferred, and a (meth)acryloyloxy group is most preferred.

The number of carbon atoms in an alkoxide moiety excluding the crosslinkable group in the above-described crosslinkable alkoxide ligand is preferably 1 to 10, more preferably 1 to 5, and particularly preferably 2 or 3.

The alkyl group may be of either a straight chain or a branched chain, and the number of carbon atoms thereof is preferably 1 to 10, more preferably 2 to 5, and particularly preferably 2 or 3. Specific examples of the alkyl group include methyl, ethyl, propyl, i-propyl, and t-butyl.

The alkenyl group may be of either a straight chain or a branched chain, and the number of carbon atoms thereof is preferably 2 to 10. Specific examples of the alkenyl group include vinyl and propenyl. In addition, a carbon-carbon double bond in the alkenyl group may exist in an arbitrary position in a molecular chain.

In the aryl group, the number of carbon atoms is preferably 6 to 20, and more preferably 6 to 15. Specific examples of the aryl group include phenyl and naphthyl.

In the case where any of Rx's is an aryl group, application to a display having a top emission structure is not preferred, because the absorption wavelength of the compound overlaps with a visible light region.

In the cycloalkyl group, the number of carbon atoms is preferably 3 to 20, and more preferably 3 to 15. Moreover, the number of rings is preferably 3 to 8, more preferably 3 to 6, and still more preferably 5 or 6. A cycloalkyl ring in the cycloalkyl group may be a monocyclic ring or a fused ring (a cycloalkane may be fused with another cycloalkane.).

Specific examples of the cycloalkyl group include cyclopropyl, cyclobutyl, cyclopentyl, dicyclopentanyl, and cyclohexyl.

In the heterocyclic group, the number of carbon atoms is preferably 3 to 8, and more preferably 3 to 6. A heterocyclic ring in the heterocyclic group preferably has at least one hetero atom selected from an oxygen atom, a nitrogen atom, and a sulfur atom as a ring-constituting atom. Moreover, the heterocyclic ring in the heterocyclic group is preferably a five-membered ring or a six-membered ring, and may be a monocyclic ring or a ring fused with any other ring (a benzene ring, for example).

Specific examples of such a heterocyclic group (i.e. heterocycle) include a thiophene ring, a furan ring, a pyrrole ring, an imidazole ring, a pyrazole ring, a triazole ring, a tetrazole ring, an oxazole ring, a thiazole ring, a pyridine ring, a pyrrolidine ring, a piperidine ring, a piperazine ring, a morpholine ring, and a thiomorpholine ring.

Specific examples of the heterocyclic group include pyridyl and piperidinyl.

A group in which Rx has a crosslinkable group is preferably an alkyl group or alkenyl group each having a crosslinkable group, and more preferably an alkyl group having a crosslinkable group.

Among these groups, preferred is an alkyl or alkenyl group each having a crosslinkable group selected from a thiol group, a (meth)acryloyloxy group, an isocyanate group, an oxetane group, and an epoxy group; more preferred is an alkyl group having a crosslinkable group selected from a thiol group, a (meth)acryloyloxy group, an isocyanate group, an oxetane group, and an epoxy group; and particularly preferred is 2-(meth)acryloyloxyethyl, 2-(meth)acryloyloxypropyl, or 3-(meth)acryloyloxypropyl.

In the acyl group, the number of carbon atoms is preferably 2 to 10, and more preferably 4 to 6. Specific examples of the acyl group include acetyl, propionyl, benzoyl, acryl, and methacryloyl.

Formula (a)

wherein, in formula (a), O* designates O of ORx in formula (1).

R¹ designates an alkyl group, an alkenyl group or an acyl group.

The acyl group in R¹ contains a crosslinkable group in the structure thereof, and the crosslinkable group is preferably a radically polymerizable group, and more preferably a (meth)acryloyl group.

An alkyl group, an alkenyl group, and an acyl group in $R^1$ each have the same meanings as in the alkyl, the alkenyl group, and the acyl group in formula (1), and a preferred range is also identical thereto.

In formula (a), $R^2$ designates a hydrogen atom or an alkyl group, and preferably a hydrogen atom.

An alkyl group in $R^2$ has the same meaning as in the alkyl group in formula (1), and a preferred range is also identical thereto.

$R^3$ designates an alkyl group or an alkoxy group, and preferably an alkoxy group.

In the alkyl group in $R^3$, the number of carbon atoms is preferably 1 to 10, more preferably 1 to 5, and particularly preferably 1.

The alkoxy group in $R^3$ will be described later.

Rx, $R^1$, $R^2$, and $R^3$ each may have an arbitrary substituent, and specific examples of such a substituent include an alkyl group (preferably an alkyl group having 1 to 10 carbon atoms, and more preferably an alkyl group having 1 to 5 carbon atoms), an allyl group, an aryl group (preferably an aryl group having 6 to 20 carbon atoms, and more preferably an aryl group having 6 to 15 carbon atoms), a benzyl group, an acyl group (preferably an acyl group having 2 to 10 carbon atoms, and more preferably an acyl group having 4 to 6 carbon atoms), a carboxy group, and a (meth)acryloyl group.

The crosslinkable organometallic desiccant in the present invention is inactivated by reacting with water as described below. Therefore, the sealing resin composition of the present invention is preferably manufactured and handled under arid conditions. Further, it is preferred that constituting materials of the sealing resin composition of the present invention, including additives described below, are used after being subjected to dewatering in advance.

In particular, in the case where all of the ligands to a central metal each are an alkoxide, because of a high reaction activity with water molecule, the crosslinkable organometallic desiccant is inactivated by a reaction with moisture contained in the atmosphere, in the manufacturing process of the sealing resin composition, which results in lowering of drying capacity.

Therefore, among the crosslinkable organometallic desiccants represented by formula (1), a metal complex compound represented by formula (2) is preferred.

Formula (2)

In formula (2), n, M, Rx, $R^1$, $R^2$, and $R^3$ each have the same meanings as those of n, M, Rx, $R^1$, $R^2$, and $R^3$ in formula (1), respectively. In formula (2), at least one of Rx's or at least one of $R^1$ to $R^3$ has a crosslinkable group.

In the present invention, in formula (2), $R^1$ particularly preferably designates a methyl group, $R^2$ particularly preferably designates a hydrogen atom, and $R^3$ particularly preferably designates a methyl group. That is, the metal complex compound represented by formula (2) more preferably has a ligand having an acetylacetonate coordinating group.

Further, in formula (2), $R^3$ particularly preferably designates an alkoxy group, and the compound represented by formula (1) particularly preferably has a ligand having an acetoacetoxy ester coordinating group.

In the alkoxy group in $R^3$, the number of carbon atoms is preferably 1 or more. Further, from the viewpoint of compatibility with the (meth)acrylic resin, the carbon atom number of 2 or more is preferred, and 10 or more is more preferred. Further, from the viewpoint of a water vapor barrier property, the carbon atom number of 20 or less is preferred.

Examples of the alkoxy group include methoxy, ethoxy, propoxy, isopropoxy, butoxy, t-butoxy, octyloxy, 2-ethylhexyloxy, decyloxy, dodecyloxy, pentadecyloxy, hexadecyloxy, and octadecyloxy.

Further, as for the crosslinkable organometallic desiccant represented by formula (1), a crosslinkable organometallic desiccant is more preferred, in which bimolecular alkoxide ligands and a monomolecular ligand having an acetylacetonato coordinating group coordinate to one central metal M.

The ligand having an acetylacetonato coordinating group is a divalent ligand having a stable keto-enol structure, and therefore the dissociation constant is small and a reaction activity with a water molecule is low.

For this reason, adjustment of the reaction activity with a water molecule can be achieved, by using the crosslinkable organometallic desiccant having both an alkoxide ligand having a high reaction activity with a water molecule and a ligand having an acetylacetonato coordinating group which has a low reaction activity.

The crosslinkable organometallic desiccant represented by formula (1) contains an acetoacetoxy compound.

Further, a state is more preferred, where a crosslinkable organometallic desiccant and a metal hydroxide which is a reaction product of the crosslinkable organometallic desiccant with water coexist alongside in the sealing resin composition of the present invention.

In general, the organic resin readily absorbs water, and almost often contains moisture of several thousand ppm. It is impractical to carry out dehydration of an organic resin containing such a large amount of moisture, by vacuum drying or ustulation so that the moisture content becomes several ppm or less. For this reason, in the case where an organic light-emitting diode element is sealed with an organic resin in which moisture has not been dehydrated sufficiently, the organic light-emitting diode element becomes deteriorated due to the moisture in the sealant.

In contrast, by preliminarily dehydrating moisture in the sealing resin composition by the crosslinkable organometallic desiccant, the moisture in the resin is dehydrated, and the moisture content in the sealing resin composition is enabled to be controlled to 10 ppm or less. A lifetime of the organic light-emitting diode element sealed using the thus-dehydrated sealing resin composition is prolonged, in comparison with the lifetime of the organic light-emitting diode element sealed using the sealing resin composition not subjected to dehydration.

Further, the crosslinkable organometallic desiccant remaining in the sealing resin composition reacts with moisture invading into an organic light-emitting device after sealed, and plays a role in dehydration.

Further, the crosslinkable organometallic desiccant contained in the sealing resin enhances hydrophobicity of the substrate surface. As a result, in the case of a sealing resin having a low affinity with an element (device) substrate or a sealing substrate, the crosslinkable organometallic desiccant is effective, because the affinity is improved, and it can be lowered invasion of water from an interface between the sealing resin and the substrate.

Further, when the compound represented by formula (1) has the ligand having the acetoacetoxy ester coordinating group, compatibility of the sealing resin composition with the crosslinkable organometallic desiccant is satisfactory, and therefore neither phase separation nor white turbidity is caused in the crosslinkable organometallic desiccant even in a liquid state before cured and also in a solid state after cured, and high water vapor barrier property is obtained by a synergistic effect between a water absorbing effect caused by the crosslinkable organometallic desiccant and high affinity (bond strength) with the substrate. However, by the resin composition in which the phase separation or the white turbidity can be seen before and after cured, the foregoing effects are not obtained, and therefore a sufficient sealing performance is not exerted.

In the present invention, it is preferred that the crosslinkable organometallic desiccant M(ORx)n reacts with water as shown in the following reaction formula (I).

M(OR*x*)*n*+*t*H$_2$O→M(OH)*t*(OR*x*)*n-t*+*t*R*x*OH    Reaction formula (I)

In reaction formula (I), t designates an integer of 1 or more and less than n.

The RxOH released by reaction with water is preferably a compound which is well miscible with a (meth)acrylic resin or the like. In other words, it is preferred that the ORx is such a ligand that the dissociated compound RxOH is well miscible with a (meth)acrylic resin or the like.

Such a crosslinkable organometallic desiccant M(ORx)n is obtained by alcohol exchange between an aluminum alkoxide and a hydroxy (meth)acrylate, for example.

Specific examples of the aluminum alkoxide include: aluminum ethylate, aluminum isopropylate, aluminum diisopropylate monosecondary-butylate, aluminum secondary-butylate, aluminum ethylacetoacetate diisopropylate (ALCH), aluminum trisethylacetoacetate (ALCHTR), aluminum alkylacetoacetate diisopropylate (ALUMI-CHELATE M), aluminum bisethylacetoacetate monoacetylacetonate (ALUMI-CHELATE D), aluminum trisacetylacetonate (ALUMI-CHELATE A), aluminum oxide isopropoxide trimer, aluminum oxide octylate trimer, and aluminum oxide stealate trimer, each of which is available (each manufactured by Kawaken Fine Chemicals Co., Ltd.).

Specific example of the hydroxy (meth)acrylate include: 4-hydroxybutyl acrylate, hydroxypropyl acrylate, and hydroxyethyl acrylate (all, manufactured by Osaka Organic Chemical Industry Ltd.), 1,4-cyclohexanedimethanol monoacrylate, and 2-hydroxy-3-phenoxypropyl acrylate (all, manufactured by The Nippon Synthetic Chemical Industry Co., Ltd.), 2-hydroxybutyl acrylate, 2-hydroxy-3-phenoxypropyl acrylate, 2-hydroxyethyl methacrylate, 2-hydroxypropyl methacrylate, 2-hydroxyethyl acrylate, 2-hydroxypropyl acrylate, 2-hydroxybutyl methacrylate, and 2-hydroxy-3-acryloyloxypropyl methacrylate (all, manufactured by Kyoeisha Chemical Co. Ltd.); and all can be obtained as an commercial product.

Moreover, as the crosslinkable acetoacetoxy ester, use can be made of: 2-acetoacetoxyethyl methacrylate as a commercial product obtained from the Nippon Synthetic Chemical Industry Co., Ltd., or the like.

Hereinafter, a usage embodiment of the electronic-device-sealing resin composition of the present invention, is described in detail with reference to figures. Note that, the usage embodiment of the present invention is not limited thereto.

<<Electronic-Device-Sealing Resin Composition>>

Figure 1:
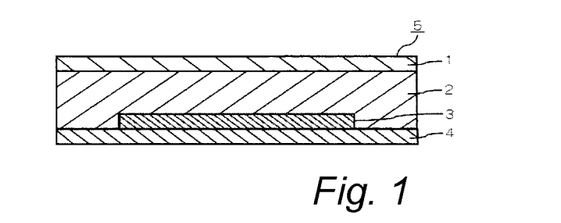
FIG. 1 is a schematic cross-sectional view showing one embodiment in which an organic light-emitting diode element is sealed and then cured with the sealing resin composition of the present invention.

The electronic-device-sealing resin composition of the present invention is used to seal an organic light-emitting diode element 3 in an organic light-emitting diode device 5, as shown in FIG. 1. In more detail, the electronic-device-sealing resin composition is crosslinked and cured, and arranged, as a sealing rein 2, between a sealing substrate 1 and an organic electronic device element, such as organic light-emitting diode element 3 provided on an element substrate 4. In this way, the organic light-emitting diode element 3 is tightly sealed with the element substrate 4 and the sealing substrate 1, so that any of various kinds of organic electronic devices, such as an organic light-emitting diode device 5 having a solid adhesion sealing structure is obtained. Examples of the organic electronic devices include an organic electroluminescence display (organic EL display), an organic electroluminescence lighting (organic EL lighting), an organic semiconductor, and an organic solar cell.

The electronic-device-sealing resin composition of the present invention contains the above-described crosslinkable organometallic desiccant.

A content of the crosslinkable organometallic desiccant is preferably 1 to 25 mass % in 100 mass % of a total resin to be contained in the sealing resin composition.

<Resin Monomer>

Moreover, the electronic-device-sealing resin composition in the present invention preferably contains a monomer compound (a resin monomer) which is crosslinked and cured by polymerization.

As a resin monomer which is formed into a polymer by radical polymerization, the resin monomer containing a vinyl group therein is preferred. Specific examples thereof include ethylene, styrene, vinyl chloride, butadiene, (meth)acrylic ester, acrylonitrile, and vinyl acetate, and a monomer of a derivative thereof. From ease of a polymerization reaction, the resin monomer is preferably a (meth)acrylate monomer [(meth)acrylate], more preferably a (meth)acrylate ester monomer [(meth)acrylate ester], and particularly preferably an acrylate ester monomer [acrylate ester].

In addition, under a cationic polymerization environment, the oxygen atom in formula (1) serves as a cationic polymerization inhibitor, to lower the crosslink density, resulting in lowering water vapor permeability in several cases.

In the electronic-device-sealing resin composition of the present invention, if viscosity thereof is low, contact with the sealing substrate is improved, to facilitate sealing work. Therefore, the viscosity of the electronic-device-sealing resin composition of the present invention is preferably 10 Pa·s or less, and more preferably 1 Pa·s or less.

If overuse of a low-molecular-weight monomer is made for achieving low viscosity, however, the crosslink density of the sealing resin is made high, and an elastic modulus also becomes high, and therefore sealed portion peeling by cure shrinkage is made high. Therefore, in order to lower the elastic modulus of a cured resin to lower such a peeling, a resin having the number-average molecular weight of 1,500 to 5,000 is preferably blended. Thus, from a viewpoint of improving flexibility, the number-average molecular weight of the resin to be blended is preferably 2,000 or more, and more preferably 3,000 or more. Moreover, from viewpoints of excellent compatibility with the low-molecular-weight monomer and good contact with the sealing substrate, the number-average molecular weight is preferably 4,000 or less, and more preferably 3,500 or less.

Note that, the number-average molecular weight is a value calculated by subjecting a 1% solution obtained by dissolving it in tetrahydrofuran to gel permission chromatography (GPC equipment: GPC system manufactured by Waters Corporation, column: "TSKgel GMHHR-N" manufactured by Tosoh Corporation, flow rate: 1.0 mL/min), and then converting the measured value into the polystyrene conversion number-average molecular weight.

A radically polymerizable resin monomer in the present invention is a polyfunctional radically polymerizable resin monomer in which 1.5 to 3 polymerizable groups are contained in one molecule. The number of polymerizable groups is 1.5 to 3, but preferably 2 to 3, and more preferably 2.

In addition, specific examples of the radically polymerizable resin monomer in which 1.5 polymerizable groups are contained therein include an equimolar mixture of a radically polymerizable resin monomer in which one polymerizable group is contained in one molecule, and a radically polymerizable resin monomer in which two polymerizable groups are contained in one molecule.

As such a polymerizable resin monomer, a (meth)acrylate ester monomer [(meth)acrylate ester] having a urethane bond in the molecule thereof is particularly preferred.

Herein, the viscosity of the polymerizable resin monomer is preferably 1,000 to 5,000 Poise/45° C.

<Additives>

The sealing resin composition of the present invention may contain any of other additives, to the extent in which they do not deteriorate the water vapor barrier property or bendability of the sealing resin. Examples of the foregoing additives include: a polymerization initiator, a polymerization inhibitor, a diluent, a tackifier, a crosslinking aid, a frame retardant, a filler, a coupling agent, and the like.

Examples of the diluent include: a low-viscosity (meth) acrylic monomer or polybutene. Examples of the tackifier include: a rosin-based resin, a petroleum-based resin, a terpene-based resin, a chromane resin, hydrated compounds of these resins, or the like.

Further, in order to enhance the attachment thereof to a sealing object, the sealing resin composition of the present invention may contain an epoxy group-containing resin and a cationic polymerization initiator, and resins whose polymerization is initiated by a cationic polymerization initiator.

As the polymerization initiator, a photopolymerization initiator is preferred, and specific examples thereof include a ketone compound (an acetophenone compound, and a benzophenone compound), a benzoate compound, a benzoylformate compound, a benzoylphosphine oxide compound, a bisbenzoylphosphine oxide compound, and a thioxanthone compound.

A content of the polymerization initiator is preferably 0.01 to 5 mass %, and more preferably 0.1 to 5 mass %, in the sealing resin composition.

Specific examples of the polymerization inhibitor include a phenol compound, such as 2,6-di-t-butyl-p-cresol, 4,4'-methylenebis(2,6-di-t-butylphenol), and octadecyl 3-(3,5-di-t-butyl-4-hydroxyphenyl)propionate, and a hydroquinone compound.

A content of the polymerization inhibitor is preferably 0.01 to 1.0 mass %, and more preferably 0.05 to 1.0 mass %, in the sealing resin composition.

Next, the electronic device of the present invention will be described.

<<Electronic Device>>

The electronic device of the present invention is an electronic device, especially an organic electronic device, sealed by using the above-described sealing resin composition of the present invention.

Hereinafter, as an example of the organic electronic device, an organic light-emitting device (image display device) is described.

An organic light-emitting device 5 is a so-called top emission or bottom emission light-emitting device. As shown in FIG. 1, an organic light-emitting diode element 3 provided on an element substrate 4 is sealed with a sealing substrate 1 through a sealing resin 2. Note that, the sealing resin 2 means a resin which is formed by cured the sealing resin composition of the present invention.

Note that, as to the foregoing organic light-emitting device 5, a sealing lateral face thereof may be exposed. In other words, an additional sealing processing is not necessarily conducted, by a glass frit, an adhesive, or the like, as a sidewall sealant. This is attributed to a fact that the sealing resin composition of the present invention has both high water vapor barrier property and adhesion property. As describe above, in the sealing resin composition of the present invention, application of further closing processing, by a glass frit, or the like, is unnecessary, and only one operation is needed in a resin application step, and therefore a structure of the organic light-emitting device 5 can be simplified, and lightweight and cost reduction can also be achieved.

Further, because a rigid glass frit or the like is not used, in the case where a flexible material is used for an element substrate 4 or a sealing substrate 1, the provision of a so-called flexible device becomes possible, in which flexibility has been given to the organic light-emitting device 5 itself. Further, the device as a whole is flexible and lightweight, and therefore becomes hard to destructible, even if the device is subjected to impact, such as a fall.

Figure 2:
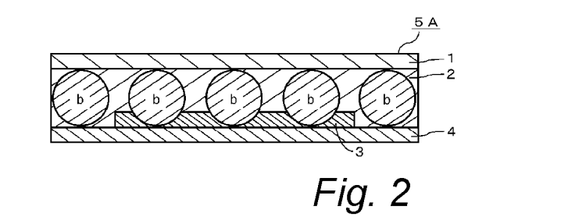
FIG. 2 is a schematic cross-sectional view showing one embodiment in which an organic light-emitting diode element is sealed and then cured with the sealing resin composition of the present invention, together with a spacer for a uniform sealing.

In the present invention, other than the organic light-emitting device 5 as shown in FIG. 1, an organic light-emitting device 5A as shown in FIG. 2 is also preferred. In FIG. 2, in order to place a sealing substrate 1 and an element substrate 4 parallel to one another, a spacer b having a proper height to the intended thickness of the sealing resin is incorporated into the device. In the drawings, the same reference numeral among individual drawings refers to the same element.

Unless the height of the spacer b to be used is practically the same in any spacer b, it becomes difficult to place the sealing substrate 1 and the element substrate 4 parallel to one another.

As to the spacer b, it is preferred to use a spherical shaped filler, or a pillared pillar formed by a photolithography. Further, as to the material thereof, either organic or inorganic materials may be adopted, unless there is a danger that any of them crushes and destroys an organic light-emitting diode element with a pressure at the time of sealing. Note that, as regards the material, an organic resin is preferred, because the organic resin is excellent in affinity to the sealing resin composition of the present invention, and a cross-linked acrylic resin is more preferred, because deterioration of the gas barrier property is lessened.

The spacer b is not particularly limited, and use can be made of: examples of the spacer b including: ENEOS Uni-Powder manufactured by JXTG Nippon Oil & Energy Corporation, HAYABEADS manufactured by Hayakawa Rubber Co., Ltd., and the like.

The placement density of the spacer b per $mm^2$ of the substrate is preferably $10/mm^2$ or more, more preferably $50/mm^2$ or more, and still more preferably $100/mm^2$ or more, form the viewpoint of placing the sealing substrate 1 and the element substrate 4 parallel to one another. If the placement density is less than 10/mm², it becomes difficult to uniformly maintain a distance between the upper substrate and the lower substrate.

From the viewpoint of a resin viscosity, the placement density of the spacer per mm² of the substrate is preferably 1,000/mm² or less, more preferably 500/mm² or less, and still more preferably 300/mm² or less. If the placement density is more than 1,000/mm², the resin viscosity becomes too high, and resultantly the sealing working becomes difficult.

From the viewpoint of a surface asperity-tracking performance with respect to a substrate (sealing face), the thickness of the sealing resin is preferably 0.5 μm or more, more preferably 1 μm or more, and still more preferably 2 μm or more. If the thickness of the sealing resin is less than 0.5 μm, irregularity of the organic light-emitting diode element cannot be sufficiently absorbed, and resultantly a space between substrates cannot be completely sealed.

Further, from the viewpoint of a water vapor barrier property, the thickness of the sealing resin is preferably 100 μm or less, more preferably 50 μm or less, and still more preferably 30 μm or less. If the thickness of the sealing resin is more than 100 μm, the area of the sealing resin exposing to the atmosphere increases, so that a sealing effect lowers, because a moisture intrusion amount becomes larger.

Note that, when a spacer b is used, the thickness of the sealing resin corresponds to a height of the spacer b.

Figure 3:
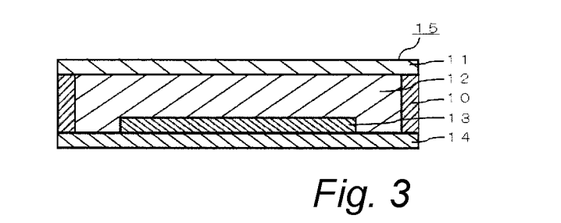
FIG. 3 is a schematic cross-sectional view showing another embodiment in which an organic light-emitting diode element is sealed and then cured with the sealing resin composition of the present invention.

The sealing resin obtained from the sealing resin composition of the present invention may be used for the organic light-emitting device 15, which is subjected to an additional hermetic sealing with a sidewall sealant (a glass frit or an adhesive) 10 or the like, as shown in FIG. 3. In this case, a high airtightness is maintained, due to a synergetic effect between the sealing resin composition of the present invention and the sidewall sealant (the glass frit or the adhesive) 10. For this reason, an organic light-emitting device 15, in which a sealing resin 12 obtained from the sealing resin composition of the present invention is used in combination with the sidewall sealant (the glass frit or the adhesive) 10, is preferred, from the viewpoint of realizing a long life of the organic light-emitting device 15.

A production method of the organic light-emitting device using the sealing resin composition of the present invention is as follows. On the above occasion, specific examples of a method of placing the sealing resin composition include: a spin coating method, a dip coating method, a spray coating method, a slit coating method, a bar coating method, a roll coating method, a gravure printing method, a flexographic printing method, a screen printing method, and a flow coating method.

Regarding the organic light-emitting device 5 which has not been subjected to a hermetic sealing at a frame portion as shown in FIG. 1, firstly, on an organic light-emitting diode element substrate 4 on which organic EL (an organic electroluminescence) element parts have been formed in the form of lamination, a suitable amount of the sealing resin composition of the present invention is coated so as to cover an organic light-emitting diode element 3, and further a sealing substrate 1 is placed thereon from above so as to sandwich the sealing resin composition of the present invention in between the element substrate 4 and the sealing substrate 1. In this way, a hermetic sealing is performed so as not to form voids in between the element substrate 4 and the sealing substrate 1. After that, the sealing resin composition of the present invention is cured by ultraviolet irradiation, to form a sealing resin 2, so that a sealing is completed.

Alternatively, at the beginning, a sealing resin composition of the present invention is coated on a sealing substrate 1, and then an organic light-emitting diode element 3 is placed on the sealing resin composition, and after sandwiching them in between the sealing substrate and an element substrate 4, the sealing resin composition of the present invention is cured by ultraviolet irradiation, to form a sealing resin 2. Thus, the sealing is also completed.

In the case of a structure as shown in FIG. 3, whose dam structure portion is formed surrounding around an organic light-emitting diode element 13 with an adhesive, a gas-barrier sealant, or a glass frit-hardened material, as a sidewall sealant 10, thereby lowering moisture invasion from a sealing edge, at the beginning, the sidewall sealant (adhesive) 10 is formed on an element substrate 14 or a sealing substrate 11. After that, a sealing resin composition of the present invention is poured into the inside of the sidewall sealant (adhesive) 10 formed around the forgoing organic light-emitting diode element 13, and further another substrate is placed so as to sandwich the sealing resin composition of the present invention in between the one substrate and the another substrate. In this way, a hermetic sealing is performed so as not to form voids in between the element substrate 4 and the sealing substrate 11. After that, the sealing resin composition of the present invention is cured by ultraviolet irradiation, to form a sealing resin 12, thereby completing a sealing.

If these sealing processes are carried out under the drying environment, deterioration in the hygroscopic nature of the sealing resin obtained from the sealing resin composition of the present invention is preferably lessened.

Figure 4:
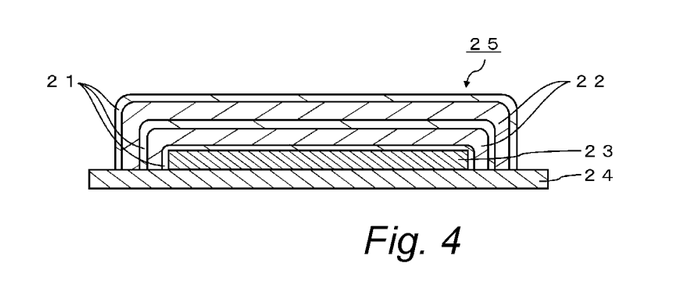
FIG. 4 is a schematic cross-sectional view showing still another embodiment in which an organic light-emitting diode element is sealed and then cured with the sealing resin composition of the present invention.

Further, the sealing resin obtained from the sealing resin composition of the present invention may be used for an organic light-emitting device 25 as shown in FIG. 4, which is formed by the following steps of coating a sealing resin composition of the present invention on an inorganic thin film 21 covering an entire upper side of an organic light-emitting diode element 23 formed on a gas-barrier element substrate 24, and then curing the sealing resin composition, to provide an organic thin film 22, and further forming thereon an inorganic thin film 21, to obtain a plurality of laminates composed of the organic thin film 22 and the inorganic thin film 21, whereby a hermetic sealing is completed. In this case, the organic resin acts as the sealing resin. A high airtightness is maintained, due to a synergetic effect between the organic thin film 22 obtained from the sealing resin composition of the present invention and the inorganic thin film 21. The number of laminates is not limited to the embodiment shown in FIG. 4, but is arbitrarily designed, as long as the above-described effect can be obtained.

Herein, the inorganic thin film 21 is composed of a silicon nitride compound, a silicon oxide compound, an aluminum oxide compound, aluminum, or the like. Formation of the inorganic thin film 21 is carried out by plasma CVD (PECVD), PVD (physical vapor deposition), ALD (atomic layer deposition), or the like. The thickness of one layer of the inorganic thin film 21 is preferably 1 μm or less, from the viewpoint of bendability.

The organic thin film 22 is formed by coating a resin composition using an existing method, such as an ink jetting method, a spray coating method, a slit coating method, and a bar coating method, and then curing the resin composition by ultraviolet irradiation. The thickness of one layer of the organic thin film 22 is preferably 5 μm or less, from the viewpoint of bendability, but preferably 1 μm or more, and more preferably 5 μm or more, from the viewpoint of impact resistance to an organic EL element.

In the organic light-emitting device using the sealing resin composition of the present invention, a color filter for chromaticity adjustment may be installed. Regarding an installation location of the color filter in this case, in the case of the embodiments shown in FIGS. 1 to 3, the color filter may be installed in between the sealing resin 2(12) and the sealing substrate 1(11) or the element substrate 4(14), or the color filter may be installed so as to sandwich the element substrate 4(14) in between the color filter and an organic light-emitting diode element 3(13), or alternatively may be installed so as to sandwich the sealing substrate 1(11) and the sealing resin 2(12) in between the color filter and the element substrate 4(14). In the case of the embodiment shown in FIG. 4, the color filter may be installed on the top of the inorganic thin film 21, or below the element substrate 24. In this case, it is preferred that the color filter is immobilized with the sealing resin composition of the present invention or another transparent resin composition.

Moreover, an organic EL element (not shown) having: a laminate formed by interposing (sandwiching) an organic light-emitting material layer composed of an organic material between a pair of electrodes facing to each other; a structure for blocking the laminate from outdoor air; and a desiccator arranged within the structure may be formed, wherein the desiccator is formed of the sealing resin composition of the present invention.

EXAMPLES

The present invention will be described in more detail based on examples given below, but the invention is not meant to be limited by these.

Reference Example

[Preparation of Crosslinkable Organometallic Desiccant]

In the following, organometallic desiccants Al(HEA)3, Al(HPA)3, Al(HEA)2CH, Al(HEA)2M, and Al(HPA)2M, each to be described later, will be described as a monomer for convenience.

[Preparation of Al(HEA)3]

First, 10 g of aluminum triisopropoxide (manufactured by Kawaken Fine Chemicals Co., Ltd.), 100 g of toluene, 17.1 g of hydroxyethyl acrylate (manufactured by Osaka Organic Chemical Industry Ltd.), and as a polymerization inhibitor, 0.1 g of 2,6-di-t-butyl-p-cresol (manufactured by Tokyo Chemical Industry Co., Ltd.) were put in a recovery flask, and dissolved therein. Al(HEA)3 was obtained by distilling off by an evaporator, at 40° C., isopropanol eliminated from aluminum triisopropoxide by an exchange reaction with hydroxyethyl acrylate, and toluene being a solvent.

[Preparation of Al(HPA)3]

Al(HPA)3 was obtained in the same manner as Al(HEA)3, except that 19.1 g of hydroxypropyl acrylate (manufactured by Osaka Organic Chemical Industry Ltd.) was used, in place of hydroxyethyl acrylate (manufactured by Osaka Organic Chemical Industry Ltd.).

[Preparation of Al(HEA)2CH]

Al(HEA)2CH was obtained in the same manner as Al(HEA)3, except that 10 g of aluminum ethylacetoacetate-diisopropylate (manufactured by Kawaken Fine Chemicals Co., Ltd., 2 in the number of carbon atoms in an alkyl group of acetoacetoxy ester) was used, in place of aluminum triisopropoxide (manufactured by Kawaken Fine Chemicals Co., Ltd.), and that 8.5 g of hydroxyethyl acrylate (manufactured by Osaka Organic Chemical Industry Ltd.) was used.

[Preparation of Al(HEA)2M]

Al(HEA)2M was obtained in the same manner as Al(HEA)3, except that 10 g of aluminum alkylacetoacetate-diisopropylate (manufactured by Kawaken Fine Chemicals Co., Ltd., 18 in the number of carbon atoms in an alkyl group of acetoacetoxy ester) was used, in place of aluminum triisopropoxide (manufactured by Kawaken Fine Chemicals Co., Ltd.), and that 4.7 g of hydroxyethyl acrylate (manufactured by Osaka Organic Chemical Industry Ltd.) was used.

[Preparation of Al(HPA)2M]

Al(HPA)2M was obtained in the same manner as Al(HEA)3, except that 10 g of aluminum alkylacetoacetate-diisopropylate (manufactured by Kawaken Fine Chemicals Co., Ltd., 18 in the number of carbon atoms in an alkyl group of acetoacetoxy ester) was used, in place of aluminum triisopropoxide (manufactured by Kawaken Fine Chemicals Co., Ltd.), and that 5.3 g of hydroxypropyl acrylate (manufactured by Osaka Organic Chemical Industry Ltd.) was used.

EXAMPLES

Preparation of Sealing Resin Composition

Example 1

As a (meth)acrylate resin, 9.8 g of TEAl-1000 (trade name, manufactured by Nippon Soda Co., Ltd., polybutadiene-terminated urethane di(meth)acrylate resin), as a crosslinkable organometallic desiccant, 0.1 g of Al(HEA)3, as a polymerization initiator, 0.1 g of Esacure TZT (trade name, a mixture of 2,4,6-trimethylbenzophenone and 4-methylbenzophenone, polymerization initiator, manufactured by DKSH Japan K.K.), and as a polymerization inhibitor, 0.01 g of 2,6-di-t-butyl-p-cresol (manufactured by Tokyo Chemical Industry Co., Ltd.) were placed, and the resultant mixture was stirred at room temperature (25° C.) for 1 hour, to obtain a sealing resin composition in Example 1.

Examples 2 to 8 and Comparative Examples 1 and 2

Sealing resin compositions in Examples 2 to 8 and Comparative Examples 1 and 2 were obtained in the same manner as in Example 1, except that the formulation was changed to a respective formulation shown in Table 1. The following testing was conducted on the thus-obtained sealing resin composition. The results are shown in Table 1. In addition, in Examples 2 to 8 and Comparative Examples 1 and 2, as a polymerization inhibitor, 0.01 g of 2,6-di-t-butyl-p-cresol (manufactured by Tokyo Chemical Industry Co., Ltd.) was used, in the same manner as Example 1.

[Water Vapor Barrier Testing]

A composition having a formulation described in Table 1 was applied, at a thickness of 100 µm, onto a 50 µm-thick and release-treated polyethyleneterephthalate film (PET film) (trade name: E7004, manufactured by Toyobo Co., Ltd.), and the resultant material and a 25 µm-thick and release-treated PET film (trade name: E7004, manufactured by Toyobo Co., Ltd.) were laminated, and the resultant laminate was irradiated with ultraviolet light having an intensity of 3 J/cm$^2$ by using an ultraviolet irradiation apparatus. A 100 µm-thick cured film of the sealing resin composition was obtained, by peeling two sheets of the PET films from this laminate. Barrier property (water vapor permeability) was measured, by using this film under humidified conditions of 90% relative humidity at 60° C. in accordance with JIS Z 0208, the calcium chloride cup method.

Note that, when a film is put into a thermostatic oven of 60° C. and 90% relative humidity, there is a danger that the film swells due to a change in volume of the air in the cup, so that the surface area and the thickness of the sample film are changed, and as the result, the measured value becomes inaccurate. For this reason, the sample was reinforced with a 20 µm-thick cellophane tape. The moisture permeability of the 20 µm-thick cellophane tape is 3,000 g/m$^2$/24-hr at the same condition as the above, which is much larger than the moisture permeability of the sample of each of Examples and Comparative Examples, and therefore the cellophane tape does not interfere with the measurement in the moisture permeability of the sample.

[Ca Test]

The Ca test is described appropriately with reference to FIG. 5.

Figure 5A:
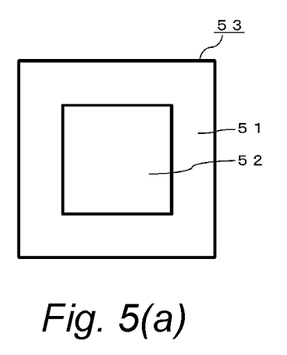
FIG. 5(a) is a plane view showing a test specimen to be used for the Ca corrosion test and FIG. 5(b) is a plane showing the corroded state of four corners of the test specimen used for the Ca corrosion test, in Examples and Comparative Examples.
Figure 5B:
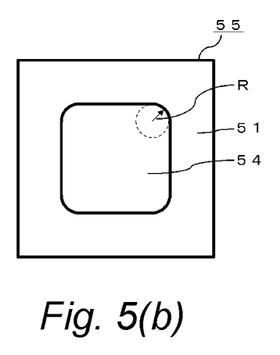

A commercially-available glass substrate (transparent glass) having dimensions of 1.2 mm×22.5 mm×14 mm was subjected to an ultrasonic cleaning and an UV-ozone cleaning at 45° C. for 10 minutes. Then, on the glass substrate, a metal calcium layer having dimensions of 10 mm×10 mm square and thickness of 100 nm was formed by vacuum deposition equipment. Then, 10 µL of liquid sealant was added dropwise thereto to be 30 µm in the thickness of the sealing resin after cured, and the resultant sealant was interposed between sealing glasses (transparent glasses) each having a dimension of 0.15 mm×18 mm×18 mm, and the resultant assembly was sealed by irradiation with ultraviolet light having an intensity of 3 J/cm$^2$, to obtain a test specimen. At this time, a distance from one side of a sealed edge to one side of a metal calcium layer was adjusted to 4 mm equally in four directions. FIG. 5($a$) and FIG. 5($b$) each show a view obtained by viewing, from above, the above-described test specimen visible through a glass substrate (in which, a portion of the above-described sealing glass is omitted). The test specimen obtained (see FIG. 5($a$)) was stored under a high temperature high humidity of 60° C. and 90% relative humidity, corner portions of metal calcium 22 were observed every 24 hours, and a test specimen in which the corner portion was rounded by corrosion of the metal calcium as in metal calcium 54 in FIG. 5($b$) (1 mm or more in R in FIG. 5($b$)) was deemed to be not passable the test.

In addition, in Table 1, an elapsed time until the test specimen was deemed to be not passable the test is described.

According to this testing, sealing capability of the sealing resin is measured, by utilizing a phenomenon in which the metal calcium on the glass substrate reacts with water molecules penetrating into the resin, and is converted into calcium hydroxide to be transparent, which is a method closer to an actual sealing aspect.

A sealing resin composition having low water vapor permeability in the above-described water vapor barrier testing gives good results also in this testing in many cases, but an influence of penetration of water molecules from an interface between the sealing resin and the substrate is exerted, and therefore the above-described testing does not agree with the water vapor barrier testing depending on affinity between the sealing resin and the substrate in several cases.

[Shear Adhesive Strength Testing]

A sealing resin composition obtained in each Example and each Comparative Example was applied onto a 0.5 mm-thick and 5 mm square glass chip (OA-10G, manufactured by Nippon Electric Glass Co., Ltd.) to be 20 µm in a thickness thereof, and the resultant glass chip was placed on a 0.5 mm-thick alkali-free glass (trade name: OA-10G, manufactured by Nippon Electric Glass Co., Ltd.) for a liquid crystal display (LCD), and irradiated with ultraviolet light having an intensity of 3 J/cm$^2$ by using an ultraviolet irradiation apparatus, to obtain a bond strength measurement sample. This measurement sample was evaluated under conditions of a measurement temperature of 25° C., a shear speed of 50 µm/s, and a shear height of 75 µm, by using a bondtester (trade name: Multi-Purpose Bondtester 4000Plus, manufactured by Nordson Advanced Technology Japan K.K. (the former Dage Japan Co., Ltd.)).

Moreover, this measurement sample was stored under high temperature and high humidity of 60° C., and 90% relative humidity for 24 hours, and then shear adhesive strength was measured in the same manner, and the measured value was taken as shear adhesive strength after humidification.

[Karl Fischer Testing]

A water content in the sealing resin composition was measured, by a vaporization Karl Fischer titration method (a coulometric titration method), in accordance with JIS K 0113, by using HYDRANAL-Coulomat AK (trade name, manufactured by Sigma-Aldrich Co. LLC) as an anolyte solution, and HYDRANAL-Coulomat CG-K (trade name, manufactured by Sigma-Aldrich Co. LLC) as a catholyte solution.

TABLE 1

|  | Ex 1 | Ex 2 | Ex 3 | Ex 4 | Ex 5 | Ex 6 | Ex 7 | Ex 8 | C Ex 1 | C Ex 2 |
|---|---|---|---|---|---|---|---|---|---|---|
| TEAI-1000 | 69% | 98% | 74% | 98% | 98% | 98% | 74% | 99% | 99% | 74% |
| Polymerization initiator | 1% | 1% | 1% | 1% | 1% | 1% | 1% | 1% | 1% | 1% |
| Alumichelate M | — | — | — | — | — | — | — | — | — | 25% |
| Al(HEA)3 | 30% | 1% | 25% | — | — | — | — | — | — | — |
| Al(HPA)3 | — | — | — | 1% | — | — | — | — | — | — |
| Al(HEA)2CH | — | — | — | — | 1% | — | — | — | — | — |
| Al(HEA)2M | — | — | — | — | — | 1% | 25% | — | — | — |
| Al(HPA)2M | — | — | — | — | — | — | — | 1% | — | — |
| Moisture permeability (g/m² · day) | 606 | 403 | 571 | 404 | 412 | 400 | 496 | 404 | 396 | 746 |
| Ca test (hr) | 96 | 120 | 288 | 120 | 144 | 168 | 360 | 168 | 48 | Un-measured (peeled off at the glass surrounding frame) |
| Shear adhesive strength (kgf/5-mm-square) | 9 | 28 | 12 | 27 | 24 | 29 | 25 | 29 | 30 | 12 |
| Shear adhesive strength after humidification (kgf/5-mm-square) | 1 | 9 | 5 | 10 | 15 | 20 | 19 | 21 | 8 | 11 |
| Shear adhesive strength keeping ratio | 15% | 33% | 43% | 38% | 63% | 70% | 77% | 73% | 27% | 88% |
| Water content (ppm) | 0 | 5 | 0 | 8 | 4 | 2 | 0 | 0 | 500 | 0 |

Note:
"Ex" means Example, and "C Ex" means Comparative Example.

[Notes to Table 1]

A unit "%" means mass %.

A symbol "-" means that no component is contained.

TEAI-1000 (trade name, manufactured by Nippon Soda Co., Ltd., polybutadiene-terminated urethane diacrylate resin, the number-average molecular weight: about 2,000, viscosity: about 3,000 Poise/45° C.)

TEAI-1000

Alumichelate M (trade name, aluminum alkylacetoacetate-diisopropylate, manufactured by Kawaken Fine Chemicals Co., Ltd.), 18 in the number of carbon atoms in alkyl group in acetoacetoxy ester.

A comparison between Examples 1 to 8 and Comparative Examples 1, 2 shows that, even if the water vapor permeability is comparable to each other, the time (lifetime) until the composition is deemed to be not passable in the calcium testing is twice or more in the sealing resin compositions in Examples 1 to 8 to which the crosslinkable organometallic desiccant specified in the present invention was added, relative to the sealing resin compositions in Comparative Examples 1, 2 to which the crosslinkable organometallic desiccant specified in the present invention was not added.

Moreover, a comparison between Example 1 and Examples 2 to 8 shows that the shear adhesive strength after humidification can be maintained by keeping, within a preferred range, the content of the crosslinkable organometallic desiccant specified in the present invention.

A comparison between Examples 1 to 4 and Examples 5 to 8 shows that, if a compound represented by formula (1) is an acetoacetoxy compound and a compound represented by formula (2) is a metal complex compound having a ligand having an acetoacetoxy ester coordinating group, the lifetime in the calcium testing can be prolonged, while the shear adhesive strength after humidification is kept high.

Further, a comparison between Example 5 and Examples 6 to 8 shows that, if the compound is a metal complex compound having a ligand having an acetoacetoxy ester coordinating group represented by formula (2), and the number of carbon atoms in an alkoxy group represented by $R^3$ in formula (2) is within the range of 10 to 20, the lifetime in the calcium testing can be prolonged, while the shear adhesive strength after humidification is kept high.

Further, the electronic device shown in FIG. 1, which is excellent in sealing performance and sealing durability, was able to be obtained, by cured the respective electronic-device-sealing resin compositions prepared in Examples 1 to 8, and sealing the organic light-emitting diode element with the resultant cured resin.

Having described our invention as related to the present embodiments, it is our intention that the invention not be limited by any of the details of the description, unless otherwise specified, but rather be construed broadly within its spirit and scope as set out in the accompanying claims.

This application claims priority on Patent Application No. 2015-017222 filed in Japan on Jan. 30, 2015, which is entirely herein incorporated by reference.

REFERENCE SIGNS LIST

1 Sealing substrate
2 Sealing resin

3 Organic light-emitting diode element
4 Element substrate
b Spacer (filler)
5, 5A Organic light-emitting device (image display device)
Sidewall sealant (an adhesive, a glass frit, or the like) 5
11 Sealing substrate
12 Sealing resin
13 Organic light-emitting diode element
14 Element substrate
Organic light-emitting device (image display device) 10
21 Inorganic thin film
22 Organic thin film (sealing resin)
23 Organic light-emitting diode element
24 Element substrate
25 Organic light-emitting device (image display device) 15
51 Sealing resin
52 Metal calcium
53 Ca test piece
54 Corroded metal calcium
55 Ca test piece after the testing
R Radius of curvature

The invention claimed is:

1. An electronic-device-sealing resin composition, comprising, as a crosslinkable organometallic desiccant, a metal complex compound having crosslinkable alkoxide represented by formula (1) as a ligand:

M(ORx)n     Formula (1)

wherein, in formula (1), M designates Al, B, Ti or Zr; Rx in the ligand designates an alkyl group, an alkenyl group, an aryl group, a cycloalkyl group, a heterocyclic group, an acyl group, or a group represented by formula (a); at least one of Rx's has a crosslinkable group; and n designates a valence of M:

Formula (a)

wherein, in formula (a), O* designates O of ORx in formula (1); $R^1$ designates an alkyl group, an alkenyl group or an acyl group; $R^2$ designates a hydrogen atom or an alkyl group; and $R^3$ designates an alkyl group or an alkoxy group.

2. The electronic-device-sealing resin composition as claimed in claim 1, wherein the metal complex compound represented by formula (1) is represented by formula (2):

Formula (2)

wherein, in formula (2), M, Rx, n, $R^1$, $R^2$, and $R^3$ each have the same meaning as those in formula (1); and at least one of Rx's or at least one of $R^1$ to $R^3$ has a crosslinkable group.

3. The electronic-device-sealing resin composition as claimed in claim 1, wherein at least one of the Rx's is a group in which replacement is made by a crosslinkable group selected from a thiol group, a (meth)acryloyloxy group, an isocyanate group, an oxetane group, and an epoxy group.

4. The electronic-device-sealing resin composition as claimed in claim 1, wherein at least one of the Rx's is an alkyl group in which replacement is made by a crosslinkable group selected from a thiol group, a (meth)acryloyloxy group, an isocyanate group, an oxetane group, and an epoxy group.

5. The electronic-device-sealing resin composition as claimed in claim 1, wherein the $R^3$ is an alkoxy group.

6. The electronic-device-sealing resin composition as claimed in claim 1, comprising a (meth)acrylate monomer.

7. The electronic-device-sealing resin composition as claimed in claim 6, wherein the (meth)acrylate monomer is a (meth)acrylate ester monomer having a urethane bond in the molecule.

8. The electronic-device-sealing resin composition as claimed in claim 1, comprising 1 to 25 mass % of the crosslinkable organometallic desiccant in a whole resin.

9. An organic EL element, having a laminate formed by interposing an organic light-emitting material layer composed of an organic material between a pair of electrodes facing to each other, a structure for blocking the laminate from the outside air, and a desiccator arranged within the structure, wherein the desiccator is formed of the electronic-device-sealing resin composition as claimed in claim 1.

* * * * *